(12) United States Patent
Hirano et al.

(10) Patent No.: US 8,063,486 B2
(45) Date of Patent: Nov. 22, 2011

(54) CIRCUIT BOARD, METHOD FOR MANUFACTURING THE SAME, AND SEMICONDUCTOR DEVICE

(75) Inventors: Koichi Hirano, Osaka (JP); Tsukasa Shiraishi, Osaka (JP); Seiichi Nakatani, Osaka (JP); Tatsuo Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 133 days.

(21) Appl. No.: 11/748,111

(22) Filed: May 14, 2007

(65) Prior Publication Data
US 2007/0262447 A1 Nov. 15, 2007

(30) Foreign Application Priority Data
May 15, 2006 (JP) .................... 2006-135576

(51) Int. Cl.
*H01L 23/48* (2006.01)
(52) U.S. Cl. ............... 257/737; 257/783; 257/E21.135; 228/180
(58) Field of Classification Search .............. 257/779, 257/784, E29.111, E51.019, 737, 783, E21.135; 228/180.22, 245; 361/783, 761
See application file for complete search history.

(56) References Cited

U.S. PATENT DOCUMENTS

| 5,431,328 | A | * | 7/1995 | Chang et al. | 228/180.22 |
| 5,956,235 | A | * | 9/1999 | Kresge et al. | 361/774 |
| 5,956,236 | A | * | 9/1999 | Corisis et al. | 361/783 |
| 6,073,829 | A | * | 6/2000 | Pienimaa | 228/180.22 |
| 6,181,569 | B1 | * | 1/2001 | Chakravorty | 361/761 |
| 6,959,856 | B2 | * | 11/2005 | Oh et al. | 228/245 |
| 7,026,721 | B2 | * | 4/2006 | Chen | 257/779 |
| 2004/0262372 | A1 | * | 12/2004 | Houle et al. | 228/246 |
| 2006/0043608 | A1 | * | 3/2006 | Bernier et al. | 257/784 |

FOREIGN PATENT DOCUMENTS

| JP | 10-209203 | 8/1998 |
| JP | 11-87424 | 3/1999 |

* cited by examiner

*Primary Examiner* — Matthew E Warren
*Assistant Examiner* — Fang-Xing Jiang
(74) *Attorney, Agent, or Firm* — Hamre, Schumann, Mueller & Larson, P.C.

(57) ABSTRACT

A circuit board 1 having a base material 10 and an electrode 11 formed on at least one main surface of the base material 10 includes an easy peeling portion 12 formed in at least one of an inner portion and a side portion of the electrode 11, with the adhesive strength between the electrode 11 and the easy peeling portion 12 being less than the adhesive strength between the electrode 11 and the base material 10. A circuit board that has high connection reliability and enables narrow pitch mounting thereby can be provided.

14 Claims, 8 Drawing Sheets

CIRCUIT BOARD, METHOD FOR MANUFACTURING THE SAME, AND SEMICONDUCTOR DEVICE

BACKGROUND OF THE INVENTION

1. Field of the Invention

The present invention relates to a circuit board used in electrical and electronic devices, a method for manufacturing the same, and a semiconductor device.

2. Description of Related Art

Following the reductions in size and profile and the high functionality of electronic devices in recent years, there has been an increasingly strong demand for the high densification of electronic components mounted on circuit boards and the high functionalization of circuit boards on which electronic components are mounted. Particularly following the high densification and high integration of semiconductor integrated circuits (LSI), rapid advances have been made in increasing the pin count and narrowing the pitch of electrode terminals in LSI chips. Small packages such as ball grid arrays (BGA), land grid arrays (LGA) and chip scale packages (CSP), and the flip-chip mounting of area bumps have been developed as high density mounting techniques that are compatible with this.

A method of flip-chip mounting a semiconductor element that is generally used, for example, involves forming solder bumps on the electrodes of the semiconductor element and solder mounting the bumps to an interposer. As for the method of mounting a small package such as a CSP to a circuit board, a connection method that involves supplying solder paste to a circuit board or the electrode portion of a semiconductor package, mounting the semiconductor package on the circuit board, and connecting the semiconductor package to the circuit board using reflow soldering generally is used.

With a solder connection such as this, the reliability of the connecting portion decreases due to the difference in thermal expansion coefficient between the interposer and the semiconductor element or between the circuit board and the semiconductor package. In particular, a major cause of electrical connection failure is stress that occurs in a connecting portion made up of different materials as a result of temperature differences associated with the environment and the device being turned ON/OFF, which leads to cracking or the like in the solder connecting portion.

Given this situation, a number of methods have been proposed in order to avoid connection failure at the connecting portion. For example, a method disclosed in JP H11-087424A involves improving the consistency of the thermal expansion coefficient, together with reinforcing the connecting portion via sealing resin, by filling the gap between the semiconductor chip and the printed wiring board with sealing resin.

However, when the gap between the semiconductor chip and the printed wiring board is filled with sealing resin, the thermal expansion coefficient in the thickness direction differs between the connecting portion and the sealing resin portion, which means that connection reliability cannot necessarily be improved even if the consistency of the thermal expansion coefficient in a direction (surface direction) orthogonal to the thickness direction can be improved. Also, filling the gap with sealing resin is not preferable due its effect on productivity, since it not only increases the lead time but uses additional material, making it desirable to improve connection reliability without using sealing resin.

Connection structures that do not use sealing resin include flip-chip mounting configurations such as that disclosed in JP H10-209203A have been proposed. The configuration disclosed in JP H10-209203A has an insulating layer provided on part of a supporting substrate, a wiring layer formed so as to extend across the surfaces of both the insulating layer and the supporting substrate and a semiconductor element bump-bonded to the wiring layer, and is characterized by the adhesive strength of the bump-bonded portion being greater than the adhesive strength of any other interface.

However, the above semiconductor device cannot adopt electrode structures such as a pad-on-via structure and is not compatible with narrow pitch mounting, since the wiring needs to be routed in a different location to the bump-bonded portion. Since the adhesive strength between the semiconductor element and the substrate is dependent on a weakly bonded portion, the overall bonding strength is reduced in comparison to conventional solder mounting, making it difficult to maintain the level of drop impact reliability required by mobile devices and the like.

The present invention was made to solve the above problems, and provides a circuit board that has high connection reliability and enables narrow pitch mounting, a method for manufacturing the same, and a semiconductor device.

SUMMARY OF THE INVENTION

To achieve the above object, a circuit board of the present invention having a base material and an electrode formed on at least one main surface of the base material includes an easy peeling portion formed in at least one of an inner portion and a side portion of the electrode, and the adhesive strength between the electrode and the easy peeling portion is less than the adhesive strength between the electrode and the base material.

A semiconductor device of the present invention includes a circuit board and a semiconductor element provided with an electrode, the circuit board being the circuit board of the present invention, and the electrode of the circuit board being electrically connected to the electrode of the semiconductor element via a bonding material.

A first method for manufacturing a circuit board of the present invention includes the steps of forming an easy peeling portion in at least one of an inner portion and a side portion of a metal foil, adhering the metal foil having the easy peeling portion formed therein to a resin base material so that an adhesive strength between the metal foil and the easy peeling portion is less than an adhesive strength between the metal foil and the resin base material; and forming an electrode by etching the metal foil.

A second method for manufacturing a circuit board of the present invention includes the steps of selectively forming on a metal foil stuck to a resin base material an easy peeling portion whose adhesive strength with the metal foil is less than an adhesive strength between the metal foil and the resin base material, forming a composite metal layer by coating on the metal foil having the easy peeling portion formed thereon a metal layer composed of the same material as the metal foil, and forming an electrode by etching the composite metal layer.

A third method for manufacturing a circuit board of the present invention includes the steps of selectively forming on a lower layer electrode provided on a base material an easy peeling portion whose adhesive strength with the lower layer electrode is less than an adhesive strength between the lower layer electrode and the base material, and forming an electrode by coating on the lower layer electrode having the easy peeling portion formed thereon an upper layer electrode composed of the same material as the lower layer electrode.

A fourth method for manufacturing a circuit board of the present invention includes the steps of selectively forming on a metal foil stuck to a resin base material an easy peeling portion whose adhesive strength with the metal foil is less than an adhesive strength between the metal foil and the resin base material, forming a composite metal layer by coating on the metal foil having the easy peeling portion formed thereon a metal layer composed of the same material as the metal foil, forming the easy peeling portion to be multilayered by repeating the step of selectively forming the easy peeling portion and the step of forming the composite metal layer, and forming an electrode by etching the composite metal layer.

DETAILED DESCRIPTION OF THE INVENTION

Figure 1A:
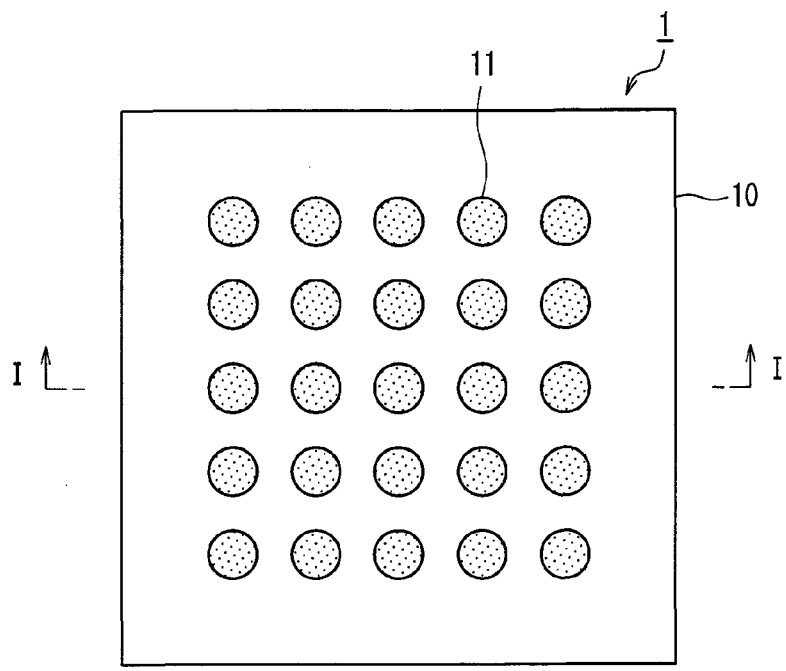
FIG. 1A is a plan view of a circuit board according to a first embodiment of the present invention.

According to the circuit board of the present invention, an easy peeling portion peels off first under stress that occurs in a connecting portion due to the difference in thermal expansion coefficient between a semiconductor element or the like and a base material when the semiconductor element or the like is mounted, because the adhesive strength between the electrode and the easy peeling portion is less than the adhesive strength between the electrode and the base material, thereby enabling the stress to be relieved. Connection reliability thereby can be improved. Also, since the easy peeling portions are provided on at least one of an inner portion and a side portion of the electrodes, an area array structure without routed wiring is possible, and compatibility with pitch narrowing is facilitated.

The semiconductor device of the present invention enables the provision of a semiconductor device in which connection reliability is high and pitch narrowing is facilitated, because of using the circuit board of the present invention.

The methods for manufacturing a circuit board of the present invention enable the circuit board of the present invention to be manufactured readily.

In the circuit board of the present invention, the easy peeling portion preferably is composed of a conductive material. This configuration enables excellent electrical conductivity to be maintained even when the easy peeling portion is arranged inside the electrode.

The conductive material preferably is a metal.

A plurality of the easy peeling portions preferably are formed per electrode. This configuration enables the effect of stress relief on in the connecting portion between a mounted component and the base material to be enhanced.

The plurality of easy peeling portions preferably are multilayered per electrode in a direction perpendicular to the base material. This configuration enables the effect of stress relief in the connecting portion between a mounted component and the base material to be enhanced further.

In each of the multiple layers, a plurality of the easy peeling portions preferably are formed in a direction parallel to the base material, and in a cross section cut in the direction perpendicular to the base material, in adjacent layers, portions forming the easy peeling portion preferably are arranged alternately with portions not forming the easy peeling portion. This configuration also enables the effect of stress relief in the connecting portion between a mounted component and the base material to be enhanced further.

The circuit board preferably is one selected from the group consisting of a printed wiring board, a build-up printed circuit board, a flexible printed circuit and a semiconductor package substrate.

The electrode preferably is composed of a metallic material that includes copper, and the easy peeling portion preferably is composed of a metallic material that includes at least one type of metal selected from the group consisting of chromium, nickel, cobalt, silver, gold, iron and aluminum, or an oxide thereof.

The electrodes preferably are arranged in an area array.

In the semiconductor device, the adhesive strength between the easy peeling portion formed in the electrode of the circuit board and the electrode of the circuit board preferably is less than an adhesive strength between the bonding material and the electrode of the circuit board. This configuration also enables stress that occurs as a result of the difference in thermal expansion coefficient between the bonding material and the electrode of the circuit board to be relieved.

The circuit board preferably includes a plurality of the easy peeling portions, and at least one of the easy peeling portions preferably peels off from the electrode of the circuit board. This configuration enables stress that occurs in the connecting portion between the semiconductor element and the base material to be relieved as a result of the easy peeling portions functioning as springs.

The circuit board preferably includes a plurality of the electrodes, and the height of at least one of the electrodes preferably is greater than an initial height of the electrode.

The circuit board preferably includes a plurality of the electrodes and a plurality of the easy peeling portions, at least one of the easy peeling portions preferably peels off from the electrodes, and the height of the plurality of electrodes above the main surface of the base material preferably is not uniform.

Further, the bonding material preferably is solder.

Embodiments of the present invention will be described below with reference to the drawings. Note that identical reference numerals are associated with to like portions in the drawing shown below, and redundant description may be omitted.

First Embodiment

Figure 1B:
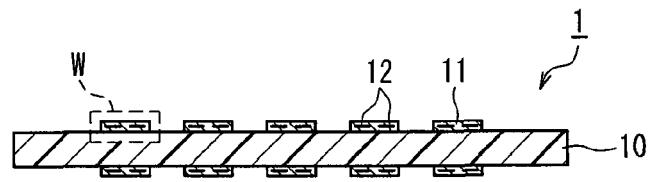
FIG. 1B is a cross-sectional view along line I-I in FIG. 1A.
Figure 1C:
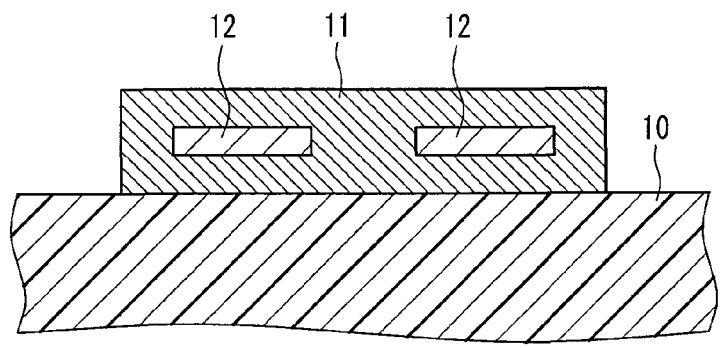
FIG. 1C is an enlarged view of a W portion of FIG. 1B.

FIG. 1A is a plan view of a circuit board according to a first embodiment of the present invention, FIG. 1B is a cross-sectional view along line I-I in FIG. 1A, and FIG. 1C is an enlarged view of a W portion of FIG. 1B.

As shown in FIGS. 1A and 1B, a circuit board 1 includes a base material 10 and electrodes 11 arranged in an area array on both main surfaces of the base material 10. Note that depiction of the internal wiring of the circuit board and the configuration of interlayer connections has been omitted. Also, in the present embodiment, the electrodes 11 are arranged on both main surfaces of the base material 10, although the electrodes 11 may be arranged on only one main surface (one side) of the base material 10.

As for the base material 10, there are no particular limitations, and it is possible, for example, to use a printed wiring board base material formed by impregnating a reinforcing material such as glass woven fabric or aramid nonwoven fabric, for example, with a thermoset resin such as epoxy resin, phenol resin or bismaleimide triazine and curing the resin, a build-up printed circuit board base material having these as core materials, a flexible printed circuit base material that uses a film such as polyimide film or liquid crystal polymer film, or a constituent base material of a semiconductor package substrate (e.g., interposer).

Using these base materials enables the circuit board 1 to be applied to a printed wiring board, a build-up printed circuit board, a flexible printed circuit, a semiconductor package substrate or the like. Alternatively, a semiconductor base material that uses a semiconductor such as silicon, a ceramic base material such as an alumina base material, or a glass ceramic base material such as a glass-alumina base material also can be used as the base material 10.

As for the electrodes 11, a material can be selected appropriately depending on the method of forming the electrodes and the type of base material 10. For example, copper can be used if a resin base material is used as the base material 10, tungsten or molybdenum can be used if a ceramic base material is used, and copper, silver, silver-palladium alloy or silver-platinum alloy can be used if a glass ceramic base material is used.

Further, easy peeling portions 12 are formed inside the electrodes 11, as shown in FIG. 1C. The easy peeling portions 12 are made to readily peel off from the electrodes 11 by forming them with a different material than the electrodes 11. The adhesive strength between the electrodes 11 and the easy peeling portions 12 is also less than the adhesive strength between the electrodes 11 and base material 10. Adhesive strength, in other words, is the strength required for delamination to occur, with delamination occurring more readily the lower the adhesive strength.

Forming the easy peeling portions 12 in the electrodes 11 allows for the relief of stress that occurs in the connecting portions when a semiconductor element or the like is mounted on a circuit board according to the present embodiment. Specifically, the easy peeling portions 12 inside the electrodes 11 peel off first under stress that occurs in the connecting portions due to the difference in thermal expansion coefficient between a mounted semiconductor element or the like and the base material 10, thereby enabling the stress to be relieved.

Further, the stress can be relieved after the easy peeling portions 12 have peeled off as a result of the easy peeling portions 12 functioning as springs. Connection reliability thereby can be improved. This is described in detail in the following second embodiment.

Also, an area array structure without routed wiring such as shown in FIG. 1A is possible, since the easy peeling portions 12 are provided inside the electrodes 11, making the circuit board 1 readily compatible with pitch narrowing, and ensuring that the easy peeling portions 12 do not interfere with the adhesion of the electrodes 11 to the base material 10. Note that "the adhesive strength between the easy peeling portions 12 and the electrodes 11" means "the adhesive strength between the easy peeling portions 12 and place inside the electrodes 11 that contacts the easy peeling portions 12."

To further improve the connection reliability in the circuit board 1, the adhesive strength between the electrodes 11 and the easy peeling portions 12 preferably is between 10% and 70% inclusive of the adhesive strength between the electrodes 11 and the base material 10. Note that adhesive strength can be measured using a 90° peel strength test based on JIS C6481, for example.

As for the easy peeling portions 12, a material that results in the adhesive strength with the electrodes 11 being less than the adhesive strength between the electrodes 11 and the base material 10 can be used. A metallic material that includes at least one member selected from the group consisting of chromium, nickel, cobalt, silver, gold, iron and aluminum, for example, or an oxide thereof preferably is used. This is because these materials are conductive and enable excellent electrical conductivity to be maintained even when the easy peeling portions 12 are arranged inside the electrodes 11. Note that the above metallic material also may be an alloy that includes at least 50% by weight, for example, of the listed metals.

The easy peeling portion 12 may be formed one per electrode 11, two per electrode 11 as in FIG. 1C, or more than two per electrode 11. In particular, forming a plurality of easy peeling portions 12 per electrode 11 is preferable because stress that occurs in the connecting portions is relieved more readily. Also, as described below, the easy peeling portions 12 preferably are multilayered.

Figure 2:
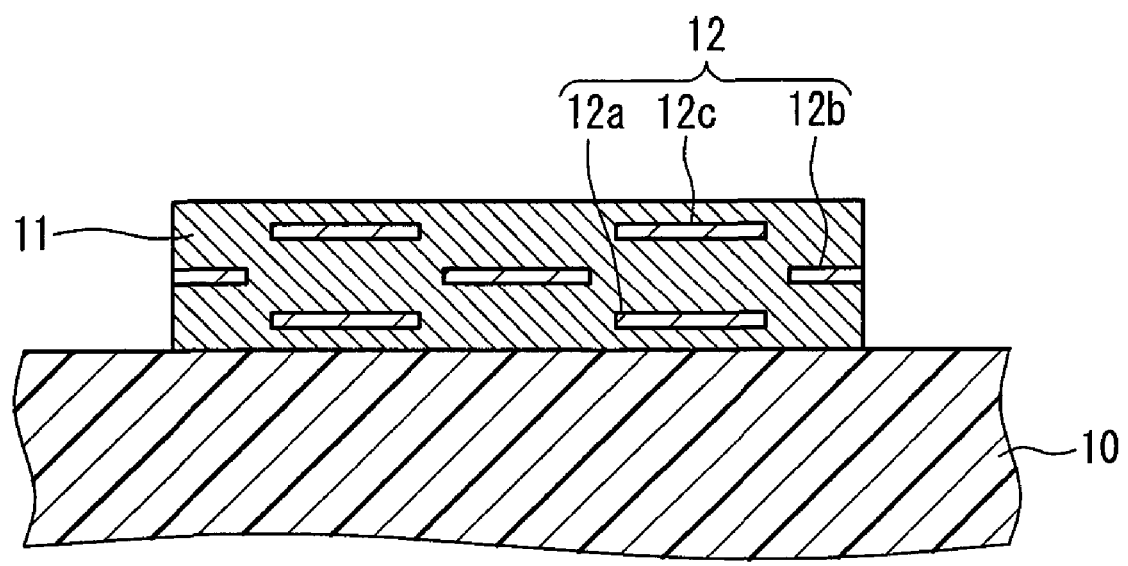
FIG. 2 is a partial cross-sectional view showing a second exemplary circuit board according to the first embodiment of the present invention.

FIG. 2 is a plan view of a circuit board according to another example of the present embodiment. While FIG. 1C shows an example in which the easy peeling portions 12 are formed with only one layer in each electrode 11, the easy peeling portions 12 in the FIG. 2 example are multilayered in each electrode 11. Each of the multiple layers is arranged in a different position relative to a direction perpendicular to the main surface of the base material 10 (height direction of electrodes 11).

FIG. 2 shows an example in which the easy peeling portions 12 have three layers. In order from the base substrate 10 side are formed a first layer formed by a plurality of easy peeling portions 12a, a second layer formed by a plurality of easy peeling portions 12b, and a third layer formed by a plurality of easy peeling portions 12c. In a cross-section perpendicular to the base material 10 such as in FIG. 2, the easy peeling portions 12 in adjacent layers are arrayed in a hound's tooth pattern, with portions forming the easy peeling portions 12 being arranged alternately with portions not forming the easy peeling portions 12.

Thus, the easy peeling portions 12 are multilayered because of the high stress relieving effect in the connecting portions compared to when the easy peeling portions 12 are formed from only one layer, and the easy peeling portions are arrayed in a hound's tooth pattern because of the even higher stress relieving effect. Such effects are thought to be obtained because stress generated in each of the easy peeling portions 12 is relieved, in comparison to when the easy peeling portions 12 are formed from only one layer.

Arraying the easy peeling portions in a hound's tooth pattern also further enhances the stress relieving effect resulting from the spring function of the easy peeling portions 12.

Note that since the multilayering of the easy peeling portions 12 itself contributes to stress relief, as aforementioned, the easy peeling portions 12 constituting the layers may overlap in the height direction of the electrodes 11, rather than it being absolutely necessary to array the easy peeling portions 12 in a hound's tooth pattern. Also, the number of layers may be determined appropriately as necessary.

The easy peeling portions 12 are not particularly limited in terms of shape, and may be laminar or columnar. The easy peeling portions 12 vary in size depending on their shape and the size of the electrodes 11, although when the easy peeling portions 12 are formed layered, it is sufficient that they have a thickness of around 0.01 μm to 2 μm, and an area of around 20% to 70% of the area of the electrodes 11.

With the circuit board 1, preferably a resin base material is used for the base material 10 and a metallic material that includes at least 95% by weight of copper is used for the electrodes 11. This makes the circuit board 1 compatible with pitch narrowing. Although with this combination, the difference in thermal expansion coefficient with the semiconductor element (described below) is comparatively large, and connection reliability generally deteriorates, the present invention enables the deterioration in connection reliability to be suppressed.

Also, with the circuit board 1, surface processing may be performed on the surface of the electrodes 11 to improve the bonding characteristics to the bonding material (described below) and to prevent oxidization. As for the surface processing method, anticorrosion processing that uses nickel plating, gold plating, solder plating or an organic solution, for example can be used. Note that while not shown in FIG. 1, solder resists or markings such as those used with conventional circuit boards may be provided on the main surface of the base material 10 in addition to the electrodes 11. Also, wiring patterns other than electrodes relating to connections may be formed.

Figure 3:
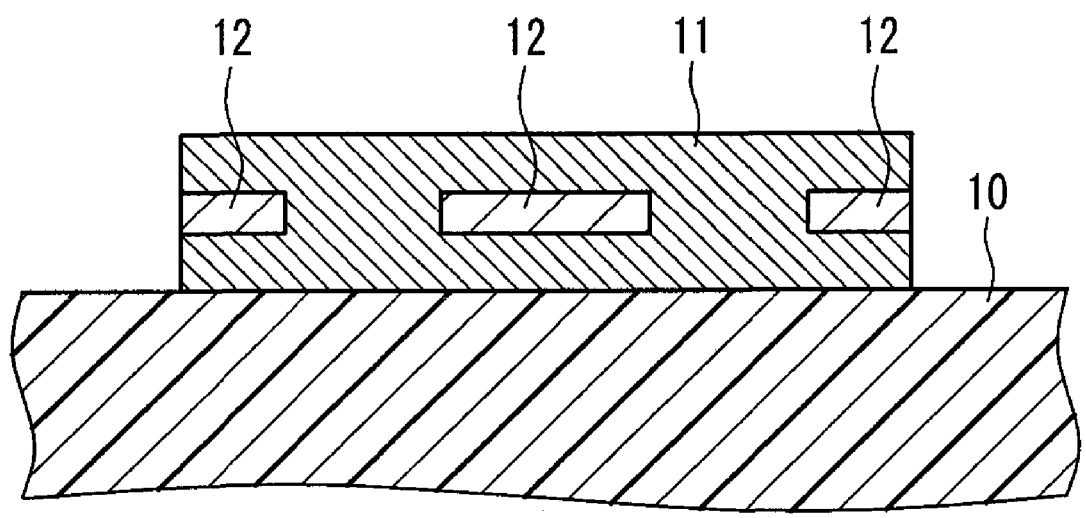
FIG. 3 is a partial cross-sectional view showing a third exemplary circuit board according to the first embodiment of the present invention.

Although the circuit board 1 according to the first embodiment of the present invention has been described above, the present invention is not limited to this configuration. For example, the circuit board may also have easy peeling portions 12 formed in the sides of the electrodes 11, as shown in FIG. 3.

Second Embodiment

Figure 4A:
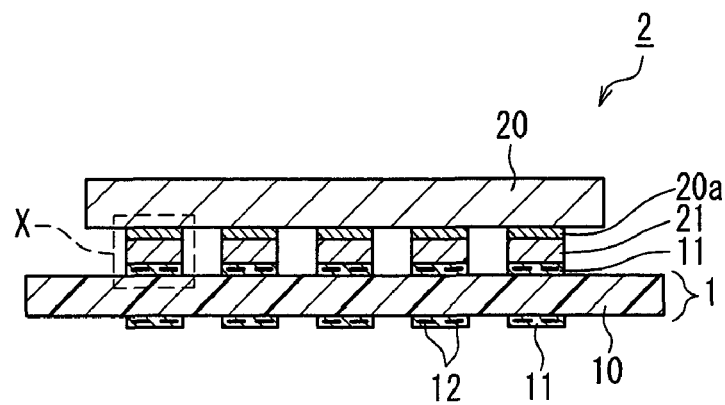
FIG. 4A is a cross-sectional view of a semiconductor device according to a second embodiment of the present invention.

FIG. 4A is a cross-sectional view of a semiconductor device according to a second embodiment of the present invention. Note that the semiconductor device according to the second embodiment uses the circuit board 1 according to the aforementioned first embodiment.

As shown in FIG. 4A, the semiconductor device 2 includes the circuit board 1 and a semiconductor element 20. Electrodes 20a provided on the semiconductor element 20 are electrically connected via solder 21 to the electrodes 11 provided on the circuit board 1. Note that the semiconductor element 20 may be a bare chip or a semiconductor package.

The adhesive strength between the easy peeling portions 12 and the electrodes 11 is less than the adhesive strength between the electrodes 11 and the substrate 10, and, furthermore, the adhesive strength between the easy peeling portions 12 and the electrodes 11 preferably is less than the adhesive strength between the electrodes 11 and the solder 21. This configuration enables connection reliability between the electrodes 11 and the solder 21 to be improved, since stress that occurs as a result of the difference in thermal expansion coefficient between the electrodes 11 and the solder 21 can be relieved.

As for the solder 21, a material that satisfies the above preferable conditions, for example, can be used. Specifically, one type of alloy selected from the group consisting of Pb—Sn alloy, Sn—Ag alloy, Sn—Ag—Cu alloy, Sn—Bi—Ag—In alloy, Sn—Bi—Zn alloy, Sn—Bi—Ag—Cu alloy, Sn—Zn alloy and Sn—Sb alloy can be used. Note that although solder is used in the present embodiment, a conductive adhesive or the like also can be used as the bonding material for bonding the electrodes 20a to the electrodes 11.

The material of the electrodes 20a is not particularly limited. The electrodes can be composed of any material as long as it can bond with the solder 21, with it being possible to use solder bumps, gold bumps or nickel-gold bumps.

Figure 4B:
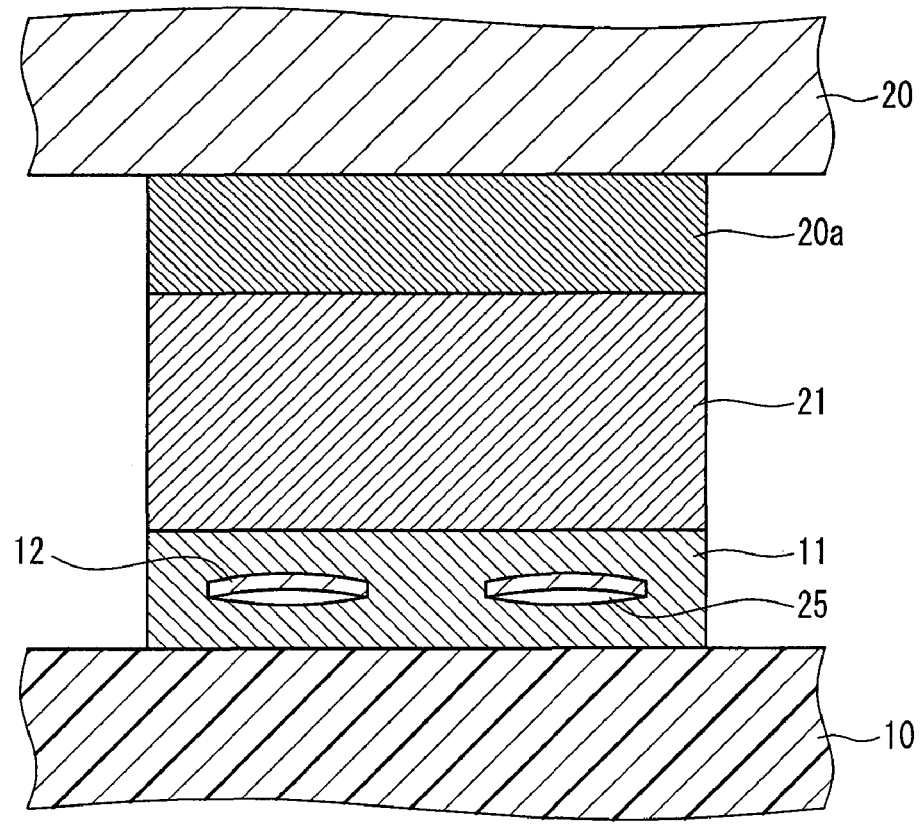
FIG. 4B is an enlarged cross-sectional view of a connecting portion of the semiconductor device shown in FIG. 4A after being subjected to thermal stress.

An enlarged cross-sectional view of a connecting portion (X portion of FIG. 4A) of the present embodiment after being subjected to thermal stress is shown in FIG. 4B. The difference in thermal expansion coefficient between the semiconductor element 20 and the base material 10 means that when they are connected with the solder 21, a force acts to bend the semiconductor device due to the difference in the amount of stretch resulting from thermal expansion between the semiconductor element 20 and the base material 10, generating thermal stress in the connections. When the temperature returns to the original temperature, the semiconductor device also returns to its original shape. Consequently, the connections repeatedly deform whenever the temperature changes. When strain occurs in the connections as a result of the thermal stress and repeated deformation, structurally weak portions break, causing connection failure.

However, according to the present embodiment, delaminated portions 25 form in the interface between the inside of the electrodes 11 and the easy peeling portions 12, as shown in FIG. 4B, prior to connection failure occurring. Since the thermal stress is thereby relaxed, the connections are less likely to break.

After the easy peeling portions 12 have peeled off from the electrodes 11 to form the delaminated portions 25, as shown in FIG. 4B, the easy peeling portions 12 can function as springs. Consequently, after the delaminated portions 25 have formed, the easy peeling portions 12 acting as springs deform when thermal stress occurs in the connections between the semiconductor element 20 and the base material 10, before the connections delaminate, and stress in the connections between the semiconductor element 20 and the base material 10 is relieved.

Figure 5:
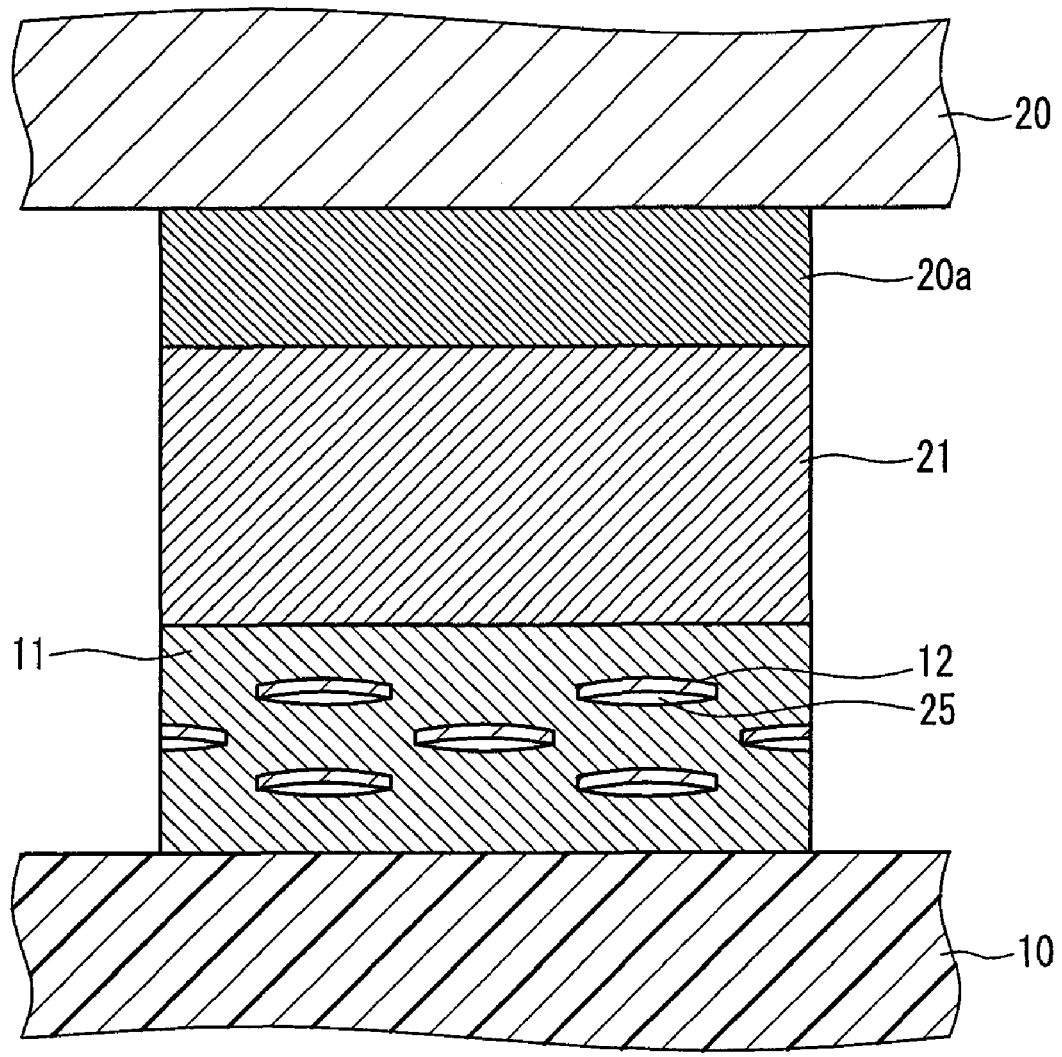
FIG. 5 is an enlarged cross-sectional view showing an example in which the easy peeling portions in the configuration of FIG. 4B are multilayered.

FIG. 5 shows an example in which the easy peeling portions 12 in the electrodes 11 of the configuration of FIG. 4B are multilayered. The multilayer structure of the easy peeling portions 12 in FIG. 5 is similar to the multilayer structure described using FIG. 2. The effects of multilayering the easy peeling portions 12 are as described in the first embodiment. That is, this configuration enables the effect of stress relief in the connections between the semiconductor element 20 and the base material 10 to be enhanced further.

Also, the functioning of the easy peeling portions 12 as springs after the easy peeling portions 12 have peeled off from the electrodes 11 to form the delaminated portions 25 is similar to the configuration in FIG. 4B. Being able to further enhance the stress relief effect as a result of the spring function of the easy peeling portions 12 when the easy peeling portions 12 are arranged in a hound's tooth pattern, as shown in FIG. 5, is similar to the configuration in FIG. 2.

The fact that in the configuration of FIG. 5, the easy peeling portions 12 need not necessarily be arrayed in a hound's tooth pattern and the number of layers of the easy peeling portions 12 can be determined appropriately as necessary is similar to the first embodiment.

The configuration in which the delaminated portions 25 have formed and the easy peeling portions 12 function as springs, as in FIGS. 4B and 5, can be said to be characterized as follows. Specifically, the height of the electrodes 11 in which the delaminated portions 25 have formed is greater than their initial height. In the case where the delaminated portions 25 form in some of the plurality of electrodes 11, the height of the plurality of electrodes 11 above the main surface of the base material 10 will not be uniform.

Note that although delaminated portions 25 have formed in all of the easy peeling portions 12 in FIGS. 4B and 5, the purpose of the present invention is not impaired even if delaminated portions form in some of the interfaces with the easy peeling portions 12 in arbitrary electrodes and at arbitrary locations. Further, although the delaminated portions 25 form at the interface on the base material 10 side of the easy peeling portions 12 in FIG. 4B, the delaminated portions may form at the interface on the solder 21 side of the easy peeling portions 12.

While the semiconductor device 2 according to the second embodiment of the present invention has been described above, the present invention is not limited to this configuration. For example, similar easy peeling portions to the easy peeling portions 12 may be formed inside the electrodes 20a provided on the semiconductor element 20. Since thermal stress thereby is further relieved, the connections are even less likely to break.

In the first and second embodiments, the easy peeling portions 12 may be provided only on electrodes 11 in places where the connection strength is weak, without necessarily needing to provide the easy peeling portions on all of the electrodes 11.

Whether to provide one or a plurality of the easy peeling portions 12 per electrode or whether the easy peeling portions 12 are to be single-layered or multilayered can be selected with a view to the required connection strength or the like, and these configurations may also be mixed.

Further, although a plurality of the electrodes 11 are provided in the example described in the first and second embodiments, the respective electrodes 11 in which the easy peeling portions 12 are formed individually can achieve the effect of stress relaxation. Thus, the present invention is effective even if only one electrode 11 is arranged on the base material 10.

Third Embodiment

Figure 6A:
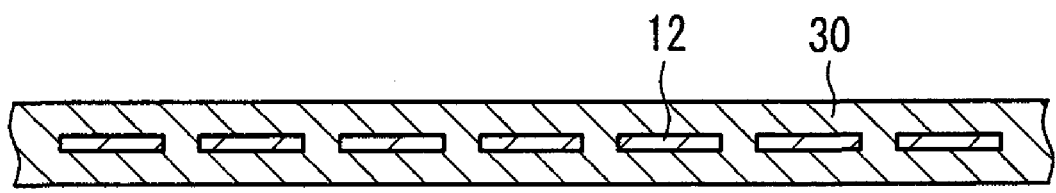
FIGS. 6A to 6C are process-differentiated cross-sectional views showing a method for manufacturing a circuit board according to a third embodiment of the present invention.
Figure 6B:
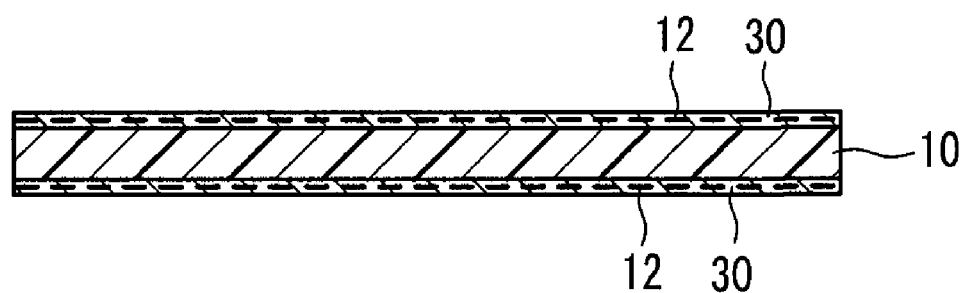
Figure 6C:
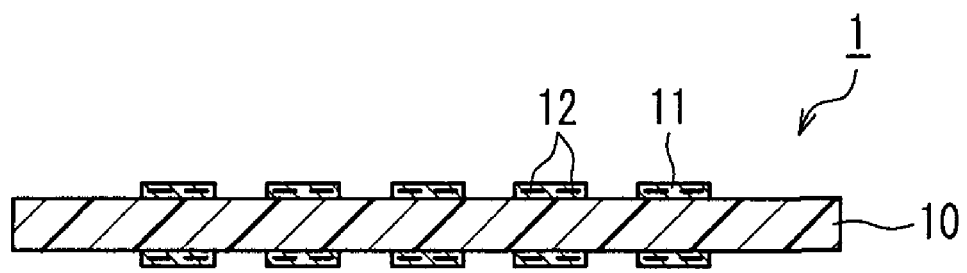

FIGS. 6A to 6C are process-differentiated cross-sectional views showing a method for manufacturing a circuit board according to a third embodiment of the present invention. Note that the method for manufacturing the circuit board according to the third embodiment is one exemplary method for manufacturing the circuit board 1 according to the aforementioned first embodiment.

Firstly, as shown in FIG. 6A, a metal foil 30 that incorporates the easy peeling portions 12 in several locations is prepared. The method of incorporating the easy peeling portions 12 in the metal foil 30 is not particularly limited. For example, the metal foil 30 may be made by forming easy peeling portions 12 selectively on a main metal foil that forms a base, and then depositing the same metal as the main metal foil over that.

Methods that can be used to form the easy peeling portions 12 include, for example, forming a plating resist on the main metal foil, partially eliminating the plating resist by patterning, and then forming the easy peeling portions 12 by plating and eliminating the plating resist, or arranging a mask on the main metal foil and then forming the easy peeling portions 12 using sputtering or vapor deposition. Further, methods such as plating, sputtering or vapor deposition can be used to deposit the same metal as the main metal foil.

Note that the thickness of the metal foil 30, although not particularly limited, preferably is 5 µm to 70 µm. The metal foil 30 may be difficult to work with if thinner than this, while fine patterning in an etching process (described below) may be difficult to perform if the metal foil 30 is thicker than this. Also, the thickness of the easy peeling portions 12, although not particularly limited, preferably is 0.01 µm to 2 µm.

Next, as shown in FIG. 6B, the metal foil 30 having the easy peeling portions 12 formed therein is adhered to both main surfaces of a base material 10 composed of resin. At this time, the metal foil 30 is adhered so that the adhering strength between the metal foil 30 and the easy peeling portions 12 is less than the adhering strength between the metal foil 30 and the base material 10. The materials of the easy peeling portions 12, the metal foil 30 and the base material 10 each can be selected so that the respective adhering strengths satisfy the above relation, for example.

In the process of adhering the metal foil 30, methods that can be used include, for example, laying an uncured thermoset resin prepreg and the metal foil 30 one on top of the other, applying heat/pressure to integrate the prepreg and the metal foil 30, and curing the uncured thermoset resin to form the base material 10, or using a thermoplastic plastic film as the base material 10, and sticking the metal foil 30 to the thermoplastic plastic film via an adhesive. A multilayer printed wiring board also may be used as the base material 10.

The metal foil 30 is then etched in a desired pattern to form the electrodes 11 shown in FIG. 6C, thereby obtaining the circuit board 1. The etching method at this time is not particularly limited, although a conventional chemical etching method that uses a photoresist can be used, for example.

Note that a process of multilayering the circuit board by repeating the processes of FIGS. 6B to 6C may be further included. Also, a subsequent process of connecting the layers may be included, in which case a through-hole process or an inner via process used in the process of making a conventional printed wiring board can, for example, be used as the method of connecting the layers. Further, a solder resist process or a marking process may be performed on the board surface.

Fourth Embodiment

Figure 7A:
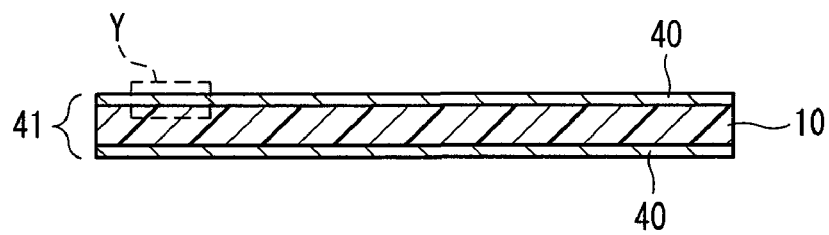
FIGS. 7A to 7E are process-differentiated cross-sectional views showing a method for manufacturing a circuit board according to a fourth embodiment of the present invention.
Figure 7B:
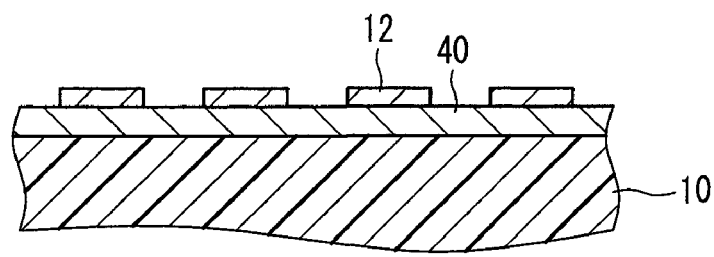
Figure 7C:
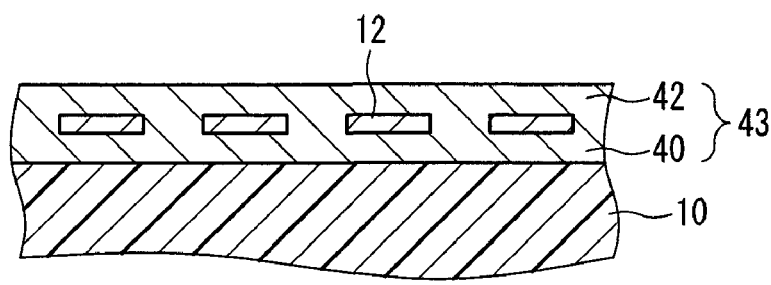

FIGS. 7A to 7E are process-differentiated cross-sectional views showing a method for manufacturing a circuit board according to a fourth embodiment of the present invention. Incidentally, FIGS. 7B and 7C are enlarged cross-sectional views of a Y portion in FIG. 7A. Note that the method for manufacturing the circuit board according to the fourth embodiment is another exemplary method for manufacturing the circuit board 1 according to the aforementioned first embodiment.

Firstly, as shown in FIG. 7A, a coated material 41 having a metal foil 40 stuck to both main surfaces of a base material 10 composed of resin is prepared. While the method of forming the coated material 41 is not particularly limited, the base material 10 and the metal foil 40 could, for example, be coated and then adhered to each other using thermocompression bonding. Note that the base material 10 and the metal foil 40 respectively can be composed of similar materials to the base material 10 and the metal foil 30 of the aforementioned third embodiment.

Next, easy peeling portions 12 whose adhesive strength with the metal foil 40 is less than the adhesive strength between the metal foil 40 and the base material 10 are formed selectively on the metal foil 40, as shown in FIG. 7B. A similar method to the aforementioned third embodiment can be used to form the easy peeling portions 12.

Figure 7D:
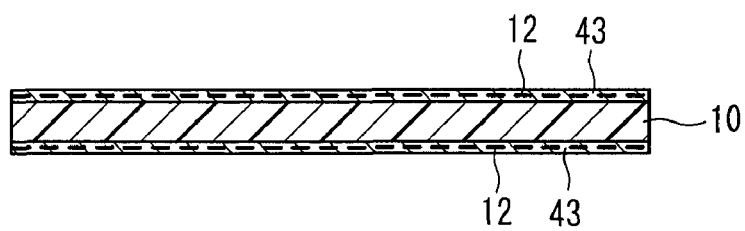

Next, as shown in FIGS. 7C and 7D, a metal layer 42 composed of the same material as the metal foil 40 is coated on the metal foil 40 having the easy peeling portions 12 formed thereon to form a composite metal layer 43. While the method of coating the metal layer 42 is not particularly limited, methods such as plating, sputtering or vapor deposition can be used, for example.

Figure 7E:
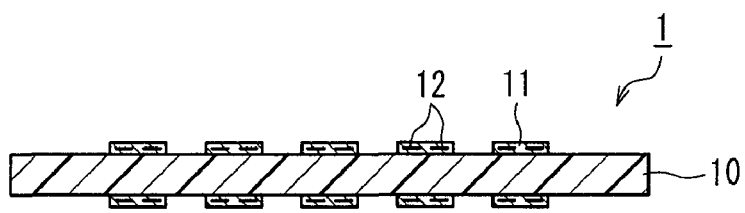

The composite metal layer 43 then is etched in a desired pattern to form the electrodes 11 shown in FIG. 7E, thereby obtaining the circuit board 1. While the etching method at this time is not particularly limited, a conventional chemical etching method that uses a photoresist can be used, for example.

In the present embodiment, a process of multilayering the easy peeling portions 12 by repeating the processing of FIGS. 7B and 7C after the process of FIG. 7C may be further included. A circuit board that includes electrodes 11 having multilayered easy peeling portions 12 such as shown in FIG. 2, for example, is obtained by etching the composite metal layer 43 in a desired pattern after multilayering the peeling portions 12.

Fifth Embodiment

Figure 8A:
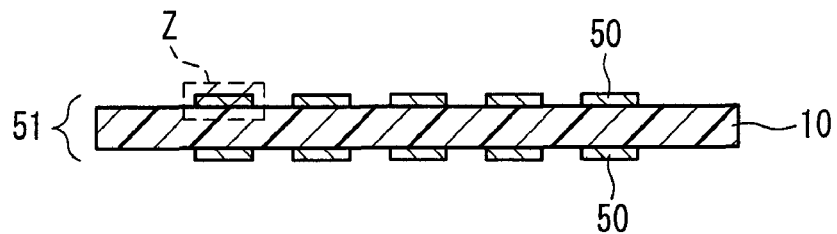
FIGS. 8A to 8E are process-differentiated cross-sectional views showing a method for manufacturing a circuit board according to a fifth embodiment of the present invention.
Figure 8B:
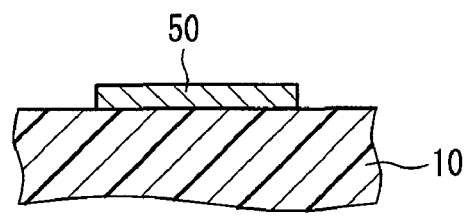
Figure 8C:
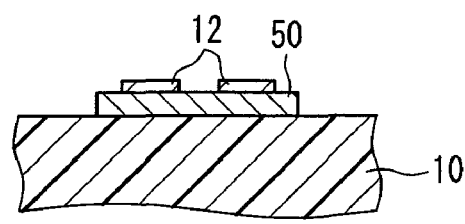
Figure 8D:
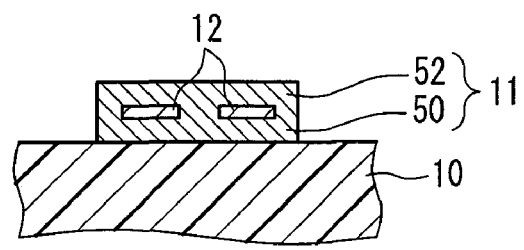

FIGS. 8A to 8E are process-differentiated cross-sectional views showing a method for manufacturing a circuit board according to a fifth embodiment of the present invention. Incidentally, FIGS. 8B to 8D are enlarged cross-sectional views of a Z portion in FIG. 8A. Note that the method for the manufacturing circuit board according to the fifth embodiment is another exemplary method for manufacturing the circuit board 1 according to the aforementioned first embodiment.

Firstly, as shown in FIGS. 8A and 8B, a substrate 51 having lower layer electrodes 50 provided on both main surfaces of a base material 10 composed of resin is prepared. The method of forming the lower layer electrodes 50 is not particularly limited, and the lower layer electrodes 50 can be formed using a known photolithography process.

Next, as shown in FIG. 8C, easy peeling portions 12 whose adhesive strength with the lower layer electrodes 50 is less than the adhesive strength between the lower layer electrodes 50 and the base material 10 are formed selectively on the lower layer electrodes 50. Methods that can be used to form the easy peeling portions 12 include similar methods to the aforementioned third embodiment, or selectively applying a conductive paste using screen printing and then curing the applied paste.

Figure 8E:
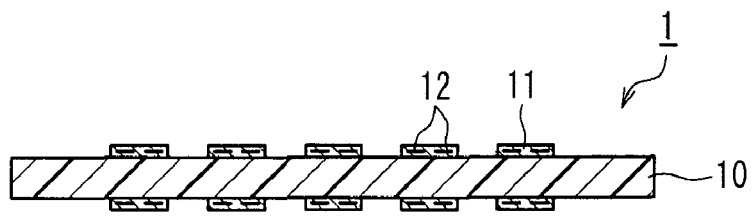

Next, as shown in FIG. 8D, upper layer electrodes 52 composed of the same material as the lower layer electrodes 50 are coated on the lower layer electrodes 50 having the easy peeling portions 12 formed thereon to form electrodes 11 composed of the lower layer electrodes 50 and the upper layer electrodes 52, thereby obtaining the circuit board 1 shown in FIG. 8E. While the method of coating the upper layer electrodes 52 is not particularly limited, methods such as plating, sputtering or vapor deposition can be used, for example.

In the present embodiment, a process of multilayering the easy peeling portions 12 by repeating the processes of FIGS. 8C to 8D after the process of FIG. 8D further may be included. A circuit board thereby is obtained that includes electrodes 11 having multilayered easy peeling portions 12 such as shown in FIG. 2, for example.

WORKING EXAMPLE

The present invention now will be described in detail using a working example. Note that the present invention is not limited to the following working example.

12 μm single treated copper foil (GTS, Furukawa Circuit Foil Co., Ltd.) was prepared. Easy peeling portions were formed by laying a stainless steel mask having 35 μm diameter openings provided in a grid at a 100 μm pitch on the shiny side of the copper foil, and using sputtering to deposit chromium and nickel over the mask, each at a thickness of 0.05 μm. The thickness of the easy peeling portions was approximately 0.1 μm. The entire surface of the copper foil having the easy peeling portions formed thereon was then copper plated to make a metal foil whose overall thickness was approximately 35 μm, as shown FIG. 6A.

Next, through holes were formed with a $CO_2$ laser in desired positions of an uncured aramid epoxy prepreg (Shin-Kobe Electric Machinery Co., Ltd.), and printing was used to fill the through holes with a conductive paste formed by mixing copper power with an uncured epoxy resin composition. Further, the metal foil was laid over both main surfaces of the prepreg and heat treated for two hours at 200° C. under a pressure of 3 MPa, thereby curing the epoxy resin to make a base material and adhering the metal foil to the base material, as shown in FIG. 6B.

A dry film resist (Nichigo-Morton Co., Ltd.) was stuck to the surface of the metal foil, and the metal foil was etched using a ferric chloride (III) solution after UV exposure and developing, to form 0.5 mm diameter grid electrodes at a 1 mm pitch. Further, after forming a solder resist (Taiyo Ink MFG. Co., Ltd.) around the electrodes, anticorrosion processing was performed on the electrode surface using an organic anticorrosive agent (Tough Ace F2, Shikoku Chemicals Corporation) to make a 0.8 mm circuit board such as shown in FIG. 6C.

In the working example, the thermal expansion coefficient of the copper foil (electrodes) was 17 ppm/° C., while the thermal expansion coefficient of the prepreg (base material) was 10 ppm/° C. The thermal expansion coefficient of both materials thus differed.

Also, the working example was the same as the above embodiments in terms of adhesive strength, with the adhesive strength between the easy peeling portions and the electrodes being less than the adhesive strength between the electrodes and the base material. This was confirmed by making a sample A and a sample B as follows. The materials of sample A and sample B were the same as the working example. Easy peeling portions were formed on 12 μm copper foil using a similar method to the working example, without laying a mask. A metal foil having an easy peeling portion formed over the entire surface of the copper foil thereby was obtained. This metal foil was adhered to a base material using a similar method to the working example to obtain sample A. On the other hand, 35 μm copper foil (easy peeling portion not provided) was adhered to a base material using a similar method to the working example to obtain sample B.

The samples were cut off at a width of 10 mm, and the metal foil was pulled off at a velocity of 50 mm/s in a 90° direction from the main surface of the base material. The peel strength at this time was measured with a tensile tester (Orientec Co., Ltd.). Sample A delaminated at the easy peeling portion, with the peel strength at this time being 0.4 kN/m. Sample B delaminated at the interface between the base material and the copper foil, with the peel strength at this time being 1.4 kN/m.

The above results confirmed that in the working example, the adhesive strength between the easy peeling portions and the electrodes (copper foil) was less than the adhesive strength between the electrodes (copper foil) and the base material.

On the other hand, a 0.8 mm circuit board was made as a comparative example with a similar method to the present working example, apart from a 35 μm single treated copper foil being used and easy peeling portions not being formed.

A 15 mm×15 mm×0.6 mm CSP ceramic substrate having 0.5 mm diameter gold plated electrodes formed at a 1 mm pitch was prepared separately instead of a semiconductor package.

Solder paste (Sn: 96.5, Ag: 3.0, Cu: 0.5, Senju Metal Industry Co., Ltd.) was printed on the respective electrodes of the circuit boards of the working example and the comparative example using a 0.14 mm metal mask with 0.5 mm diameter openings. The ceramic substrate then was installed on the circuit boards, and soldering was performed using a reflow process to mount the ceramic substrate on the circuit boards. Note that a daisy chain connection was used to connect the ceramic substrate to the circuit boards, with the connection being formed so that the resistance for all connection points could be measured from the circuit board side.

To investigate the connection reliability of the ceramic substrate mounted on these two types of circuit boards, thermal cycle tests were carried out at −55° C. and 125° C. (15 min/temp.) on ten samples each, and resistance was measured every 50 cycles. With the samples using the circuit board of the comparative example, connection failure started to occur at 400 cycles, with substantially all connection points having failed at 600 cycles, whereas with the samples using the circuit board of the working example, connection failure did not occur even after 600 cycles, and seven of the samples still showed no defects after 1000 cycles. This shows us that the reliability of the solder connecting portions improves as a result of using the circuit board of the present invention.

Note that with the samples of the working example, resistance rose slightly after 100 cycles, although resistance afterwards remained relatively stable throughout the repetitions of the thermal cycle. The rise in resistance is thought to result from the delamination of the easy peeling portions.

A dye also was permeated into the connecting portions of the samples after 1000 cycles of the thermal cycle test and the connecting portions then were observed after pulling the ceramic substrate off the circuit boards. With the circuit board of the working example, delamination occurred at the interface between the easy peeling portions and the place inside the electrodes that contacts the easy peeling portions, with the dye being found in locations facing the edges of where delamination occurred, whereas with the circuit board of the comparative example, delamination and dye marks were observed in the solder connecting portions. This tells us that breakage of the connecting portions in particular can be mitigated when the circuit board of the present invention is used.

As aforementioned, the present invention is able to provide a circuit board that has high connection reliability and enables narrow pitch mounting, a method for manufacturing the same, and a semiconductor device.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit board that includes a base material and a flat-plate electrode formed on at least one main surface of the base material, comprising:

an easy peeling portion formed in at least one of an inner portion and a side portion of the flat-plate electrode, wherein the easy peeling portion is embedded in the flat-plate electrode, the flat-plate electrode other than the easy peeling portion is composed of a single unitary metal or alloy composition from a portion of the electrode that adheres to the base material to a portion of the flat-plate electrode that is opposite to the base material, and an adhesive strength between the flat-plate electrode and the easy peeling portion is less than an adhesive strength between the flat-plate electrode and the base material;

wherein the easy peeling portion is multilayered and in a cross section cut in the direction perpendicular to the base material, in adjacent layers, portions forming the easy peeling portion are arranged alternately with portions not forming the easy peeling portion.

2. The circuit board according to claim 1, wherein the easy peeling portion is composed of a metal.

3. The circuit board according to claim 1, further comprising a plurality of flat-plate electrodes, wherein a plurality of the easy peeling portions are formed per flat-plate electrode.

4. The circuit board according to claim 3, wherein the plurality of easy peeling portions are multilayered per flat-plate electrode in a direction perpendicular to the base material.

5. The circuit board according to claim 4, wherein in each of the multiple layers, a plurality of the easy peeling portions are formed in a direction parallel to the base material.

6. The circuit board according to claim 1, wherein the circuit board is one selected from the group consisting of a printed wiring board, a build-up printed circuit board, a flexible printed circuit and a semiconductor package substrate.

7. The circuit board according to claim 1, wherein
the flat-plate electrode is composed of a metallic material that includes copper, and
the easy peeling portion is composed of a metallic material that includes at least one type of metal selected from the group consisting of chromium, nickel, cobalt, silver, gold, iron and aluminum, or an oxide thereof.

8. The circuit board according to claim 1, further comprising a plurality of flat-plate electrodes, wherein the flat-plate electrodes are arranged in an area array.

9. A semiconductor device that includes a circuit board and a semiconductor element provided with an electrode, wherein
the circuit board is the circuit board claimed in claim 1, and
the flat-plate electrode of the circuit board is electrically connected to the electrode of the semiconductor element via a bonding material.

10. The semiconductor device according to claim 9, wherein an adhesive strength between the easy peeling portion formed in the electrode of the circuit board and the electrode of the circuit board is less than an adhesive strength between the bonding material and the flat-plate electrode of the circuit board.

11. The semiconductor device according to claim 9, wherein the circuit board includes a plurality of the easy peeling portions, and at least one of the easy peeling portions peels off from the flat-plate electrode of the circuit board.

12. The semiconductor device according to claim 9, wherein the circuit board includes a plurality of flat-plate electrodes, and a height of at least one of the flat-plate electrodes is greater than an initial height of the flat-plate electrode.

13. The semiconductor device according to claim 9, wherein the circuit board includes a plurality of flat-plate electrodes and a plurality of the easy peeling portions, at least one of the easy peeling portions peels off from the flat-plate electrodes, and a height of the plurality of flat-plate electrodes above the main surface of the base material is not uniform.

14. The semiconductor device according to claim 9, wherein the bonding material is solder.

* * * * *